(12) United States Patent
Arimoto et al.

(10) Patent No.: US 7,733,933 B2
(45) Date of Patent: Jun. 8, 2010

(54) WAVELENGTH TUNABLE LASER APPARATUS AND WAVELENGTH CONTROL METHOD

(75) Inventors: Hideo Arimoto, Kodaira (JP); Kazuhiro Ito, Hinode (JP); Hiroyasu Sasaki, Yokohama (JP)

(73) Assignee: Opnext Japan, Inc., Yokohama-shi (JP)

( * ) Notice: Subject to any disclaimer, the term of this patent is extended or adjusted under 35 U.S.C. 154(b) by 38 days.

(21) Appl. No.: 11/833,271

(22) Filed: Aug. 3, 2007

(65) Prior Publication Data

US 2008/0291957 A1 Nov. 27, 2008

(30) Foreign Application Priority Data

May 21, 2007 (JP) ............................. 2007-134483

(51) Int. Cl.
*H01S 3/00* (2006.01)
(52) U.S. Cl. ...................................... 372/38.02; 372/97
(58) Field of Classification Search .................. 372/20, 372/97, 38.07
See application file for complete search history.

(56) References Cited

U.S. PATENT DOCUMENTS 5,119,393 A * 6/1992 Oka et al. ................. 372/50.22
6,738,398 B2 * 5/2004 Hirata et al. ................... 372/32
2005/0213618 A1 * 9/2005 Sochava et al. ................ 372/20

FOREIGN PATENT DOCUMENTS

JP 2006-245346 9/2006

OTHER PUBLICATIONS

Tatsuo Kunii et al.; Spectral characteristics for all MQW~-1.5 um DBR lasers; 1991 Springtime National Convention of the Institute of Electronics, Information and Communication Engineers (IEICE); Semiconductor Technology Laboratory, Oki Electric Co., Ltd. pp. 1-5.*

Tatsuo Kunii, et al.; Spectral characteristics for all MQW-1.5 um DBR lasers; 1991 Springtime National Convention of the Institute of Electronics, Information and Communication Engineers (IEICE); Semiconductor Technology Laboratory, Oki Electric Co., Ltd. pp. 1-5.

* cited by examiner

*Primary Examiner*—Minsun Harvey
*Assistant Examiner*—Patrick Stafford
(74) *Attorney, Agent, or Firm*—Antonelli, Terry, Stout & Kraus, LLP.

(57) ABSTRACT

Included are: a gain chip having a gain unit and a phase control region; a current supply for causing a positive current to flow to the phase control region; a voltage supply for applying a bias voltage to the phase control region; and a control unit for selectively driving the current supply or the voltage supply depending on a direction of the wavelength shift. The control unit drives the current supply when a laser wavelength is to be shifted to a shorter wavelength side from a wavelength with the current supply and the voltage supply being turned off, and drives the voltage supply when the laser wavelength is to be shifted to a longer wavelength side from a wavelength with the current supply and the voltage supply being turned off.

6 Claims, 7 Drawing Sheets

WAVELENGTH TUNABLE LASER APPARATUS AND WAVELENGTH CONTROL METHOD

CLAIM OF PRIORITY

The present application claims priority from Japanese application JP 2007-134483 filed on May 21, 2007, the content of which is hereby incorporated by reference into this application.

BACKGROUND OF THE INVENTION

1. Field of the Invention

The present invention relates to an external-cavity wavelength tunable laser apparatus used for optical communications, and to a wavelength control method thereof.

2. Descriptions of Related Art

The transmission capacity of optical communications is acceleratingly increasing year after year. Wavelength division multiplex (WDM) communications have been realized as an economical, high-speed and large-capacity technique to meet the demand from the increase in the transmission capacity. WDM is a technique which simultaneously uses multiple beams (tens to one hundred wavelengths) of monochromatic light each with a wavelength not longer than a 0.01-μm interval, and which transmits mutually-different signals with their respective wavelengths. WDM is capable of increasing the transmission capacity for each fiber more than tens times. This makes it possible to cut back on costs for fiber installation to a large extent.

In a conventional practice, the light source for WDM needs: various types of semiconductor laser diodes with their respective wavelengths different from one another; and apparatuses, each constructed as a module, for driving the respective semiconductor laser diodes (hereinafter referred to as "modules"). When a semiconductor laser diode is intended to be manufactured, a crystal needs to be made for each wavelength, and a module is manufactured for each wavelength. This is problematic in terms of costs. Against this background, a wavelength tunable module has been developed, which includes a gain unit (light emitting unit) and a phase control region, and which is capable of freely tuning wavelengths. This type of module is capable of tuning optical wavelengths in a range of approximately −0.02 μm shorter than the center wavelength of the light emitting device to approximately +0.02 μm longer than the center wavelength. For this reason, it suffices that light emitting devices each with several wavelengths and corresponding modules are manufactured. It is possible to supply modules of this type economically. As a result, modules of this type present a chief method of realizing WDM.

Proceedings of the Institute of Electronics, Information and Communication Engineers International Conference Spring, 1991. C-149 has disclosed a technique for tuning wavelengths while maintaining a narrow spectrum by applying a positive or negative voltage to a DBR mirror having a diffraction grating in a DBR laser.

Japanese Patent Application Laid-open Publication No. 2006-245346 is an example of the related art.

SUMMARY OF THE INVENTION

A wavelength control method using the phase control region brings about an advantage of manufacturing a wavelength tunable laser apparatus in a smaller size and more economically than any other method because the wavelength control method enables the apparatus to be integrated with a gain unit, and an advantage of holding an optical coupling loss small in the junction section between the gain unit and the phase control region. An amount of wavelength shift in the phase control region depends on the product of an amount of change in the index of refraction and the length of the phase control region. As a result, in a case where the amount of wavelength shift is intended to be increased, it is necessary that an amount of the current be increased whereas the index of refraction is reduced, or that the length of the phase control region be elongated.

FIG. 13 is a graph showing a relationship between an amount of wavelength shift and an amount of current to be flowed to a phase control region (0.2 mm in length) in a wavelength tunable module of a conventional type. FIG. 14 is a graph showing current dependency of an amount of deterioration in optical output on a waveguide unit in the phase control region (0.2 mm in length).

A needed amount of wavelength shift is approximately equal to an interval between Fabry Perot peaks of the wavelength tunable module, or equal to approximately 0.1 nm. An initial condition of the wavelength tunable module is set in order that the amount of wavelength shift can be from 0.05 nm shorter than a central operating point to 0.05 nm longer that the central operating point, or 0.1 nm in total. For example, in a case where the phase control region is 0.2 mm in length, an amount of the current which makes the amount of wavelength shift equal to 0.05 nm is approximately 4 mA. For the initial condition, as shown in FIG. 13, the 4 mA current to be flowed to the phase control region is set as the central operating point. In a case where a needed amount of wavelength shift is +0.05 nm, the current is set at 0 mA. On the other hand, in a case where a needed amount of wavelength shift is −0.05 nm, the current is set at approximately 14 mA.

Change in the index of refraction of the phase control region depends on an amount of current to be introduced into the phase control region. Increase in the amount of current to be introduced thereto raises an optical absorptivity. As shown in FIG. 14, an amount of optical loss is large, as 0.9 dB, and the optical output deteriorates markedly. For this reason, it is necessary that both the wavelength and the output be controlled. This brings about a problem of longer time needed for the control. In addition, the increase in the amount of the current raises power consumption so that heat from raised power consumption makes the optical axis likely to deviate. For this reason, the increase in the amount of the current is undesirable from the viewpoint of reduced reliability.

On the other hand, if the amount of wavelength shift is intended to be increased with a condition of a low carrier density with a low optical absorptivity (in other words, a low current density), the phase control region needs to be 0.4 mm in length. However, this makes the dimension of the gain chip larger for a semiconductor optical device, since the length of a gain region is approximately 1 mm in length. Enlargement of the gain chip decreases yields in terms of crystalline homogeneity, and reduces the number of devices obtained from each wafer, resulting in an increase in costs.

In this manner, the wavelength control of the conventional type is carried out by changing the amount of forward current to be introduced into the phase control region. However, this brings about the problem that the optical absorptivity increases under the condition that the carrier density is higher, and that the optical output accordingly decreases. For this reason, it is necessary that both the wavelength and the optical output are controlled. Moreover, when the optical absorptivity is intended to be smaller, the current density needs to be lower requiring a longer phase control region. With these taken into consideration, a wavelength control method has been awaited for, which enables a sufficient amount of wavelength shift to be obtained while holding the optical loss low.

The present invention aims at providing a method which enables a wavelength tunable laser apparatus using a phase control region to be manufactured in a smaller size, and to nevertheless obtain a larger amount wavelength shift while holding the optical absorptivity lower through additional use of a scheme of applying a negative bias to the phase control region. In the case of the present invention, an amount of forward current to be introduced into the phase control region and a negative bias applied thereto are used adequately for a phase control signal to be applied to the phase control region in order to shift wavelengths.

A conventional practice is that wavelengths are controlled by causing a forward current to flow into the phase control region, in order to change the index of refraction of the waveguide. The index of refraction is changed by use of a plasma effect of accumulated carriers obtained by accumulating carriers in the phase control region with the forward current. The inventors have found that, a wavelength shift can also be caused by applying a negative bias to the phase control region. This wavelength shifts takes place due to a long wavelength shift of a bandgap in the phase control region based on the Franz-Keldysh effect.

A wavelength tunable laser apparatus of the present invention includes: a semiconductor substrate having a region which emits light when a current is applied thereto, and a phase control region including a pn junction; a gain chip in which the light-emitting region and the phase control region are connected to each other with a waveguide; a wavelength selective mirror constituting a cavity between itself and an optical output end surface of the gain chip; a current source for causing a positive current to flow to the pn junction section in the phase control region; a voltage source for applying a negative bias to the pn junction section in the phase control region; and a control unit for selectively driving the current source or the voltage source depending on a shift direction of the wavelengths. The control unit drives the current source when a laser wavelength is to be shifted to a shorter wavelength side from a wavelength with the current supply and the voltage supply being turned off, and drives the voltage supply when the laser wavelength is to be shifted to a longer wavelength side from a wavelength with the current supply and the voltage supply being turned off.

The techniques disclosed in Proceedings of the Institute of Electronics, Information and Communication Engineers International Conference Spring, 1991. C-149 is substantially different from the constitution of the present invention, because the techniques control the DBR mirror with a diffraction grating, and because the gain region and the DBR region are each made of a semiconductor layer having a single composition.

The present invention enables a wavelength tunable laser manufactured in a smaller size with lower power consumption, and operated with a higher output. Accordingly, this does not only make it possible to enhance the device performance and increase yields remarkably, but also makes it easy for the optical communication systems to be constructed more economically, to accommodate a larger capacity, and to cover a longer-distance operation.

DETAILED DESCRIPTION OF THE PREFERRED EMBODIMENT

Descriptions will be provided hereinafter for an embodiment of the present invention.

Figure 4:
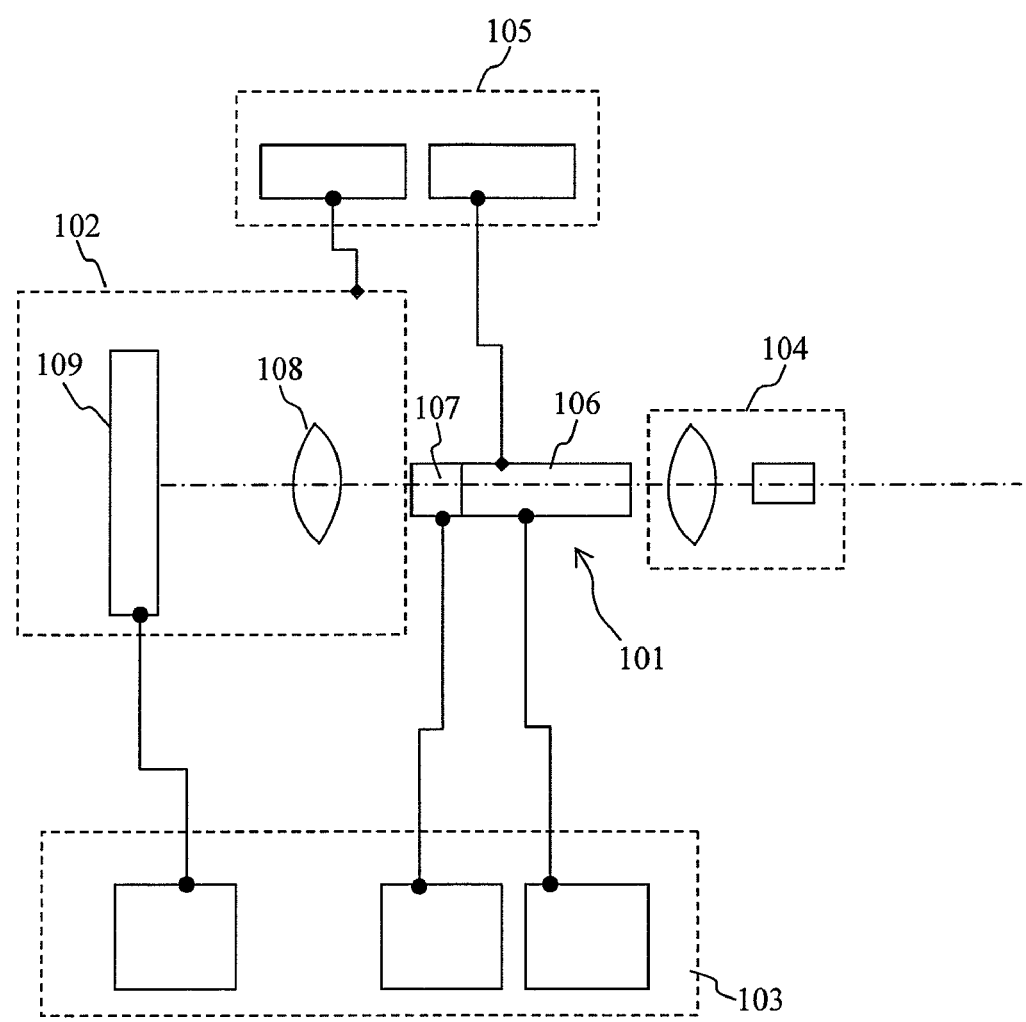
FIG. 4 is a diagram showing a rough configuration of a wavelength tuning module.
Figure 5:
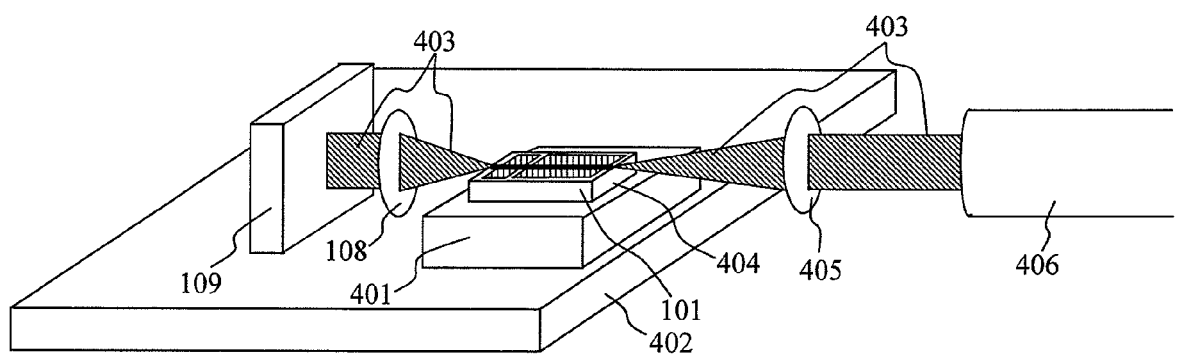
FIG. 5 is a schematic diagram showing parts which constitute a laser cavity.

FIG. 4 is a diagram showing a rough configuration of a wavelength tunable module. FIG. 5 is a schematic diagram showing parts constituting a laser cavity. The wavelength tunable module is configured of: a light emitting device 101 which is termed as a gain chip; a wavelength controlling optical system 102; an electrical system 103; an output optical system 104 for guiding light to a fiber; a temperature controlling system 105; and the like. The gain chip 101 is an integrated device configured of a gain unit 106 for emitting light and a phase control region 107. The wavelength controlling optical system 102 is configured of: a condenser lens 108; a tunable filter 109 which is capable of selecting wavelengths, and which is also used as a mirror (although the figure shows the tunable filter also used as the mirror, a mirror may be provided separately); and the like. As shown in FIG. 5, the gain chip 101 is located on a submount 401 for adjusting the height of the optical axis. A beam of light 403 outgoing from the gain chip 101 is turned into a parallel beam of light by the lens 108, and is thus guided to the tunable filter (wavelength selective mirror) 109. For the purpose of controlling the temperature of the gain chip 101 and stabilizing the optical system, the gain chip 101, the lens 108 and the tunable filter 109 are mounted on a Peltier device 402. In this respect, the laser cavity is configured of an end face 404 of the gain chip 101 and the tunable filter 109 which is used as the mirror as well, and which is capable of selecting wavelengths. The beam of laser 403 outgoing from the end face 404 of the gain chip 101 is guided to an optical fiber 406 via a lens 405. The tunable filter has a resonant grating-waveguide structure in which, a liquid crystal filter is arranged on a grating. The index of refraction and resonant wavelengths are changed by applying a voltage to the liquid crystal filter. Thereby, the wavelengths are changed. (Journal of Optical Society of America A, vol. 14, No. 11[1997])

Figure 6:
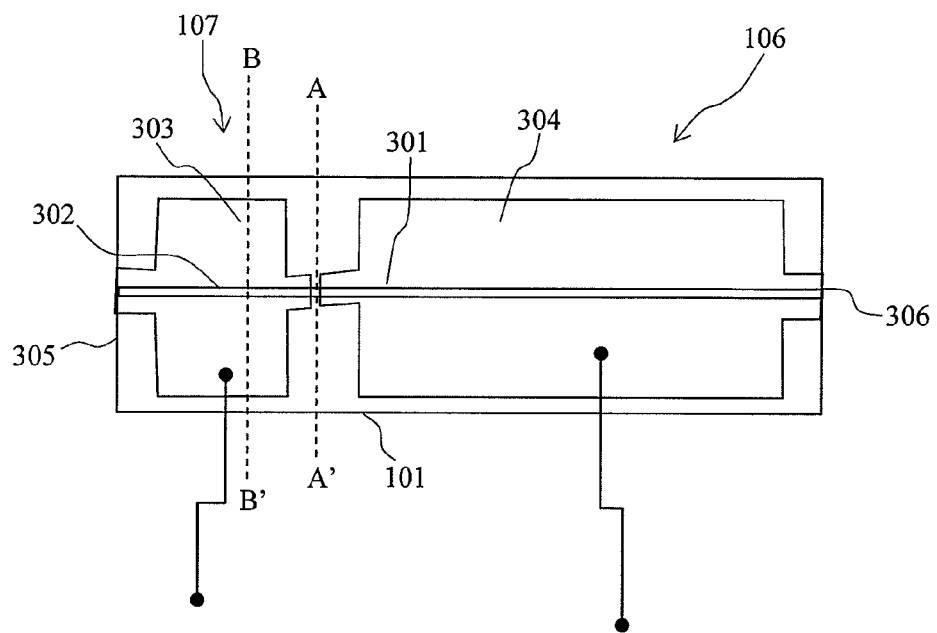
FIG. 6 is a top view of a gain chip.

FIG. 6 is a top view showing an example of a configuration of the gain chip. Although details will be described later, the portion to the right of the broken line A-A' is the gain unit 106, and the portion to the left of the broken line A-A' is the phase control region 107. Mesas 301 and 302 are formed respectively in the gain unit 106 and the phase control region 107. The mesas 301 and 302 are continuous to each other, although the mesas 301 and 302 are each formed with different base materials. The mesas 301 and 302 function as waveguides. Reference numerals 303 and 304 denote electrodes. The electrodes 303 and 304 ohmically contact the mesas 302 and 301, respectively, in a pattern which separates the electrodes 303 and 304 from each other. An electrode of conductivity type opposite to that of the electrode 303 and an electrode of conductivity type opposite to that of the electrode 304 are formed on the back of the device, although omitted from the drawing. An end face 305 of the gain chip 101 is that closer to the wavelength controlling optical system (denoted by reference numeral 102 in FIG. 4), and the other end face 306 of the gain chip 101 is that closer to the output optical system (denoted by reference numeral 104 in FIG. 4). Hereinafter, the end face 305 will be referred to as a "front end face," and the end face 306 will be referred to as a "rear end face." The reflectance of the front end face 305 is set lower, and the reflectance of the rear end face 306 is set approximately to 5% to 20%. Consequently, the interstice between the rear end face 306 and the tunable filter 109 shown in FIG. 4 functions as a cavity (the interstice will be hereinafter referred to as a "cavity").

When the beam of light from the gain chip 101 is bonded to the wavelength controlling optical system 102, a laser of high-purity monochromatic light is transmitted, the laser having a specific wavelength determined by the gain spectrum, the tunable filter 109 and the length of the cavity, and the purity of the specific wavelength being high. This will be described by use of FIGS. 7 and 8.

Figure 7:
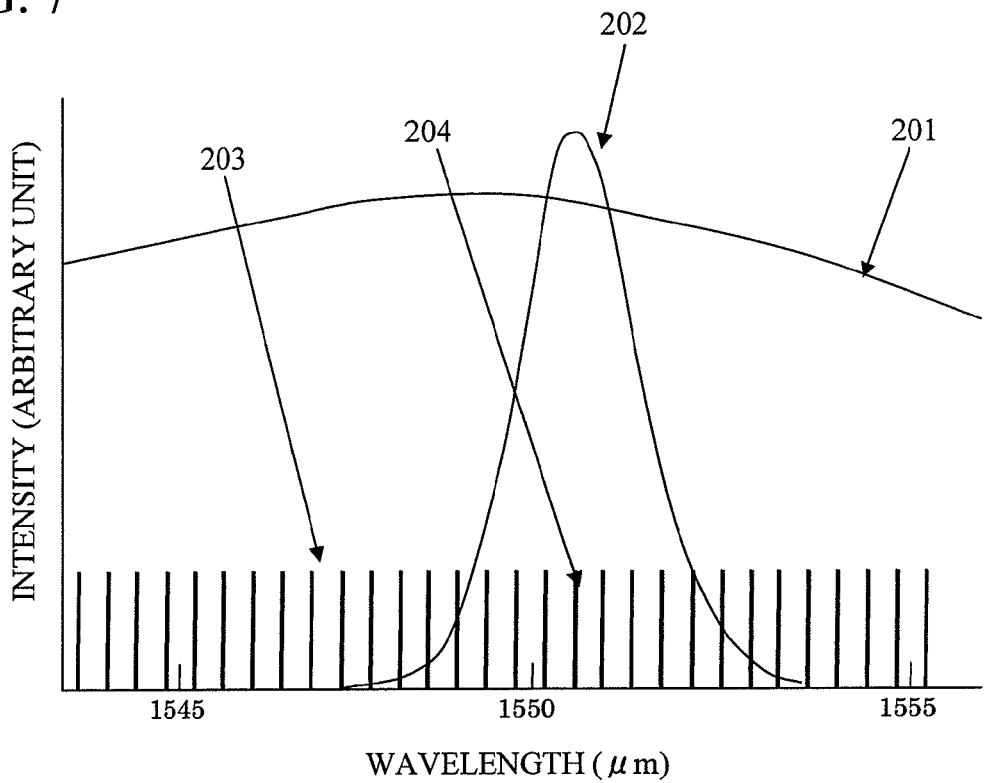
FIG. 7 is a diagram showing a spectral characteristic of each element of the cavity.

FIG. 7 is a diagram showing a spectral characteristic of each element of the cavity. The axis of abscissa indicates wavelengths, and the axis of ordinate indicates intensities. The intensities are relatively shown in each element, but arbitrarily among elements. Reference numeral 201 denotes a light emission spectrum emitted from the gain chip 101. In FIG. 7, a beam of light with this spectrum is broad light having its peak at a wavelength of 1550 nm. Reference numeral 202 denotes a reflection range of a reflection spectrum of the tunable filter 109. A beam of light with this spectrum has a single peak with a half bandwidth of approximately 1 nm. Its peak wavelength is capable of being changed by controlling a voltage to be applied to the tunable filter. Reference numeral 203 denotes a spectrum of Fabry-Perot resonance (hereinafter abbreviated as "FP") which takes place due to the optical length of the cavity. The spectrum includes many FP peaks 204 with a wavelength interval of approximately 0.08 nm. Approximately twenty of the FP peaks 204 are included in the reflection range 202. A wavelength capable of being resonated by configuration of the cavity is a wavelength that is the closest to the reflection peak of the reflection range 202 among the FP peaks 204 within the reflection range 202.

Figure 8:
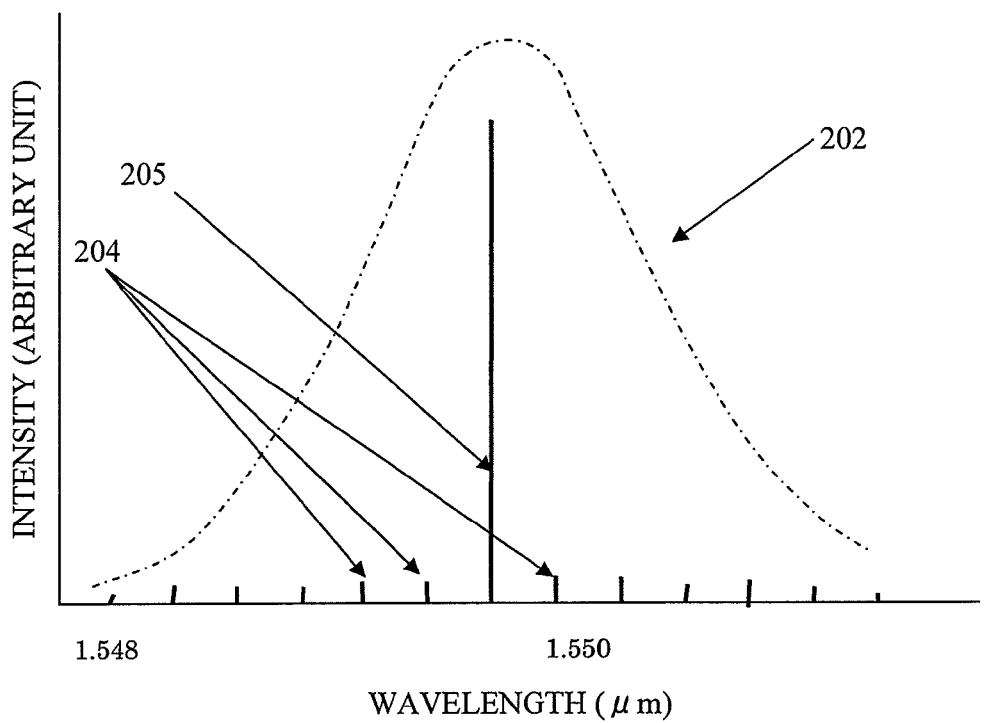
FIG. 8 is a magnified view showing a spectrum in the vicinity of a reflection range of a tunable filter.

FIG. 8 is a magnified diagram showing spectra in a vicinity of the reflection range 202 of the tunable filter 109. The intensities of the spectra are arbitrary in FIG. 8 in common with those in FIG. 7. A beam of light reciprocates in the cavity, and invites the gain chip to emit light. This reciprocation concentrates the optical energy on an FP peak 205 which is the closest to the reflection peak of the reflection range 202 among the FP peaks 204. Thereby, a laser beam is transmitted with a wavelength equal to that of the FP peak 205, and is thus introduced to the optical fiber from the output optical system 104.

Relative extensive change of wavelengths is carried out by changing wavelengths in the reflection range 202 of the tunable filter 109. On the other hand, the changing of wavelengths in the reflection range 202 is carried out by applying a voltage to the phase control region 107 in the gain chip 101. If for example, a positive current is applied to the pn junction of the phase control region 107, the concentration of carriers in the waveguide increases. Thereby, the index of refraction decreases, and the optical length is shortened. As a result, the EP peaks 204 undergo a shorter wavelength shift, and thus the EP peaks 204 as a whole shift toward the shorter wavelengths. Extensiveness of wavelength shift is capable of being controlled by the amount of current. Wavelength control using the phase control region is important for matching the reflection peak of the reflection range 202 with the FP peaks 204 for the purpose of increasing the stability of the laser transmission.

Figure 1:
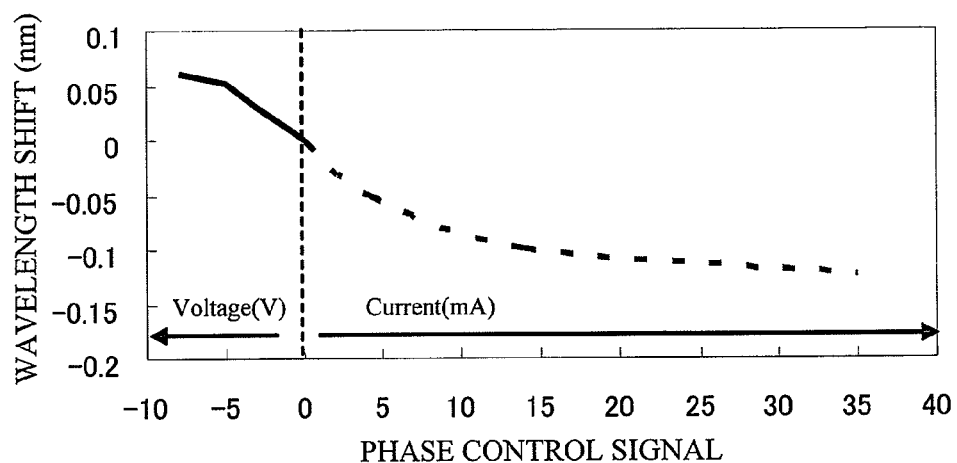
FIG. 1 is a diagram for explaining a method of controlling wavelength shift according to the present invention.
Figure 2:
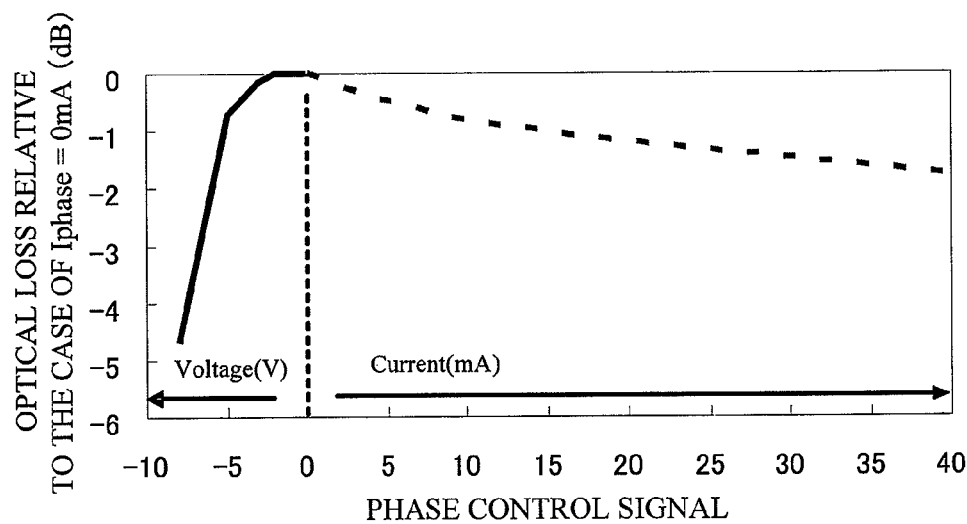
FIG. 2 is a diagram for explaining an amount of optical loss in conjunction with the control method according to the present invention.
Figure 3:
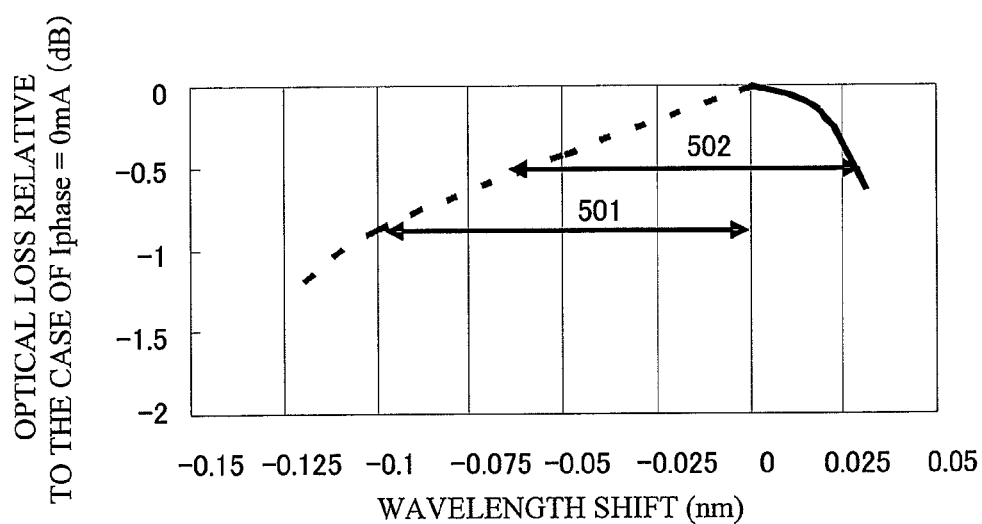
FIG. 3 is a diagram showing a result of comparison between the method according to the present invention and the method according to a conventional practice in the amount of optical loss in conjunction with the wavelength shift.

Descriptions will be provided for the wavelength control of the present invention by use of FIGS. 1 to 3. FIG. 1 is an explanatory diagram showing a method of controlling wavelength shift according to the present invention. FIG. 2 is a diagram for explaining an amount of optical loss in conjunction with the control method according to the present invention. FIG. 3 is a diagram showing a result of comparison between the method according to the present invention and the method according to a conventional practice in the amount of optical loss in conjunction with the wavelength shift.

In FIG. 1, a current is used as a unit for signals in the positive direction, whereas a voltage is used as a unit for signals in the negative direction. For a reason described later, an amount of phase control in the positive direction is capable of being controlled precisely by controlling the current, whereas an amount of phase control in the negative direction is capable of being controlled precisely by controlling the voltage. The solid line in FIG. 1 indicates an amount of wavelength shift which took place when a negative bias was applied to the phase control region, whereas the broken line indicates an amount of wavelength shift which took place when a positive current was applied to the phase control region. It was found that wavelengths were shifted by 0.025 nm by applying a negative bias of −5 V to the phase control region. At this time, an amount of optical loss was a small value of 0.5 dB as shown in FIG. 2. Thus, a desired wavelength shift can be obtained with a small amount of optical loss. FIG. 3 is a diagram showing dependency of the amount of optical loss on the amount of wavelength shift. In the case of the prior art, the phase control region needs to be operated within a range denoted by reference numeral 501. In order to obtain a 0.1 nm wavelength shift, a current to be flowed thereto needs to be increased from 0 mA to 14 mA. As a result, the optical output deteriorates by approximately 0.9 dB maximum. On the other hand, the operating range of the present invention is a range denoted by reference numeral 502. In order to similarly obtain a 0.1 nm wavelength shift, it suffices to increase a current from 0 mA to 8 mA by concurrently increasing an applied voltage from 0 V to −5 V. This holds the amount of deterioration in the optical output to approximately 0.5 dB maximum.

Subsequently, the inventors constructed the gain chip 101 having a top surface configuration as shown in FIG. 6, and thus verified the effect of the present invention. The phase control region 107 was 0.2 mm in length and the gain unit 106 was 0.8 mm in length. The mesas 301 and 302 were each 2 μm in width. The front end face 305 was coated with an antireflection film with a reflectance of 0.1%, and the rear end face 306 was coated with an antireflection film with a reflectance of 7%.

Figure 9:
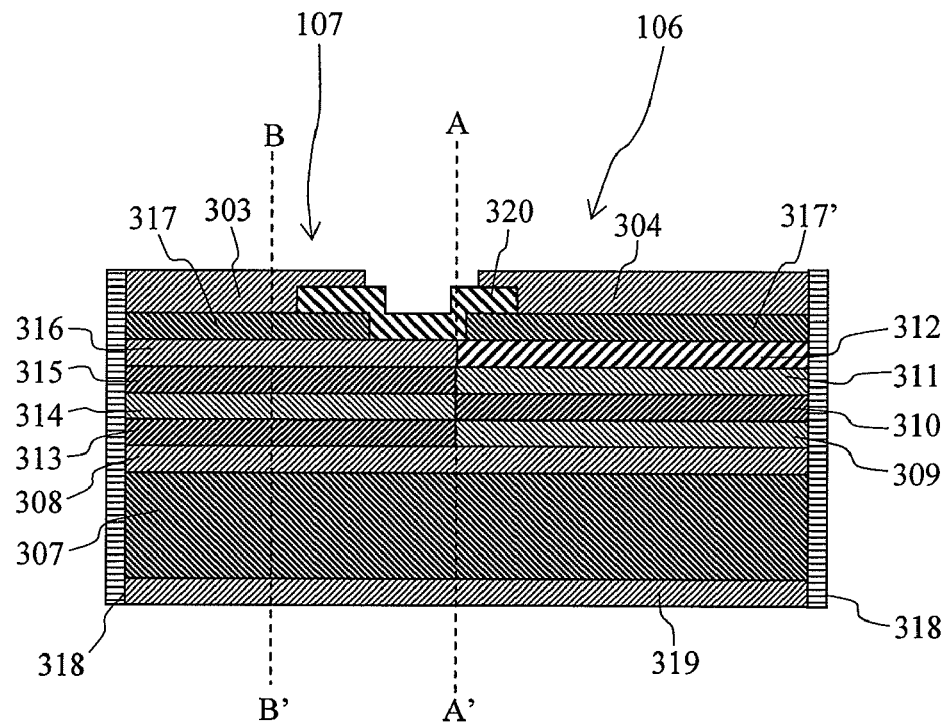
FIG. 9 is a cross-sectional view of the gain chip.
Figure 10:
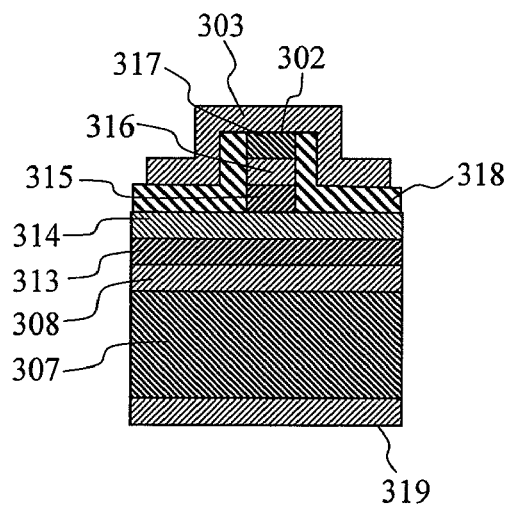
FIG. 10 is another cross-sectional view of the gain chip.

Descriptions will be provided for an internal configuration of the gain chip by use of FIGS. 9 and 10. FIG. 9 is a schematic section of the mesas 301 and 302 taken along a line running in the longitudinal direction of FIG. 6. The broken line A-A' in FIG. 9 corresponds to the broken line A-A' in FIG. 6. The portion to the right of the broken line A-A' is the gain unit 106, and the portion to the left is the phase control region 107. In FIG. 9, reference numeral 307 denotes an n-type InP substrate (with a doping concentration of $1\times10^{19}$ cm$^{-3}$); and 308, an n-type buffer layer made of InP (with a doping concentration of $2\times10^{18}$ cm$^{-3}$ and a thickness of 0.15 μm). The layers which the gain unit 106 had on the buffer layer 308 up to its top surface were different from those which the phase control region 107 had on the buffer layer 308 up to its top surface. First of all, descriptions will be provided for the gain unit 106. Reference numeral 309 denotes an n-type InGaAsP layer (with a doping concentration of $1\times10^{17}$ cm$^{-3}$ and a thickness of 0.03 μm); 310, an undoped MQW (Multiple Quantum Well) layer essentially containing InGaAsP (with a thickness of 0.06 μm); and 311, a p-type InGaAsP layer (with a doping concentration of $1\times10^{17}$ cm$^{-3}$ and a thickness of 0.03 μm). The layers 309 and 311 were each multilayered, and configured of barriers and wells. Reference numeral 312 denotes a p-type light guiding layer made of an InGaAsP layer (with a doping concentration of $5\times10^{17}$ cm$^{-3}$ and a thickness of 0.1 μm).

Subsequently, descriptions will be provided for the phase control region 107. Reference numeral 313 denotes an n-type InGaAsP layer (with a doping concentration of $1\times10^{18}$ cm$^{-3}$, a thickness of 0.05 μm and a composition wavelength of 1.0 μm); 314, an undoped InGaAsP layer (with a thickness of 0.15 μm and a composition wavelength of 1.3 μm); 315, a p-type InGaAsP layer (with a doping concentration of $5\times10^{17}$ cm$^{-3}$, a thickness of 0.05 μm and a composition wavelength of 1.0 μm); and 316, a p-type InP layer (with a doping concentration of $5\times10^{17}$ cm$^{-3}$ and a thickness of 0.1 μm). The top surface portion was common to the gain unit 106 and the phase control region 107. Reference numeral 317 and 317' denote p-type InGaAsP contact layers (with a doping concentration of $5\times10^{18}$ cm$^{-3}$ and a thickness of 0.1 μm). Parts of the contact layer 317 were removed in a vicinity of the boundary between the gain unit 106 and the phase control region 107, and a portion corresponding to the removed parts and a vicinity of the portion were coated with an insulating film 320. Reference numerals 303 and 304 denote p-type electrodes connected respectively to the phase control region 107 and the gain unit 106. The rear surface of the InP substrate 307 was provided with an n-type electrode 319 with a conductivity whose polarity is opposite to those of the conductivities of the electrodes 303 and 304. All of the foregoing crystalline layers were grown by Metalorganic Chemical Vapor deposition; the electrode metals were applied by electron beam vapor deposition; and the patternings were carried out by use of publicly-known methods including photolithography. Although the boundary (denoted by the line A-A') between the gain unit 106 and the phase control region 107 constitutes a heterojunction, light propagates continuously between the gain unit 106 and the phase control region 107.

FIG. 10 is a schematic longitudinal section of the section denoted by the broken line B-B' in each of FIGS. 6 and 9. Elements denoted by their reference numerals in FIG. 10 are the same as those denoted by the same reference numerals in FIG. 9, and the descriptions will be omitted. In this respect, the mesa 302 is formed above the InGaAsP layer 314. The waveguide is configured of the mesas 301 and 302. The transmitted laser light is propagated while distributed among the layers existing between the bottom of the mesa 302 and the InGaAsP layer 313.

A wavelength shift method of a conventional type and a wavelength shift method according to the present invention were compared at a temperature of 30° C. by setting the foregoing gain chip in the optical system shown in FIG. 4. First of all, in the case of the method of the conventional type, or in the case where a positive current of 300 mA was caused to flow to the gain unit 106 from the electrodes 304 and 319 while the current of the phase control region 107 was 0 mA, the laser wavelength was 1550.15 nm, and the optical output from the output optical system 104 was 50 mW. When a current of 4 mA was subsequently caused to flow to the phase control region 107, a −0.05 nm wavelength shift occurred; accordingly, the laser wavelength was 1550.10 nm; and the optical output was 45 mW. When a current of 14 mA was thereafter caused to flow to the phase control region 107, a −0.1 nm wavelength shift occurred, and the laser wavelength was accordingly controlled so that the laser wavelength was 1550.05 nm. However, the optical output decreased to 40 mW. For this reason, in order to increase the output up to 50 mW, an amount of the current to be flowed to the gain unit 106 was increased up to 400 mA. In response to the increase in the amount of the current, the laser wavelength changed to 1550.2 nm. As a result, a value on the current of the phase control region 107 needed to be corrected for the purpose of controlling the wavelength. Subsequently, the wavelength was changed to 1570 nm, and thereby an experiment of making a control for the optical output to be 50 mW was carried out. It took 10 seconds to stabilize the laser transmission.

After that, the wavelength shift method of the present invention was carried out by use of the same gain chip. A positive current of 300 mA was caused to flow to the gain unit 106 from the electrodes 304 and 319, and a negative bias of −5 V was applied between the electrodes 303 and 319 in the phase control region 107. At this time, the laser wavelength was 1550.175 nm, and the optical output was 48 mW. When the applied voltage was changed to 0 V (the applied current was 0 mA), a −0.025 nm wavelength shift occurred; the wavelength was 1550.15 nm; and the optical output was 50 mW. When a current of 10 mA was afterwards caused to flow to the phase control region 107 instead of a voltage being applied thereto, the wavelength shift was −0.1 nm in amount; the wavelength was 1555.10 nm; and the optical output was 48 mW. As a result, the method according to the present invention demonstrated that the amount of the positive current is reduced so that the light absorption can be avoided, because the method according to the present invention is capable of setting the central operating point lower than the method of the conventional type. Thereafter, an experiment of making a control for the optical output to be 50 mW was carried out by changing the wavelength to 1570 nm. It took two seconds to stabilize the laser transmission.

As shown by this result, the method according to the present invention makes it possible to increase the wavelength shift in amount while checking the decrease in the optical output. Because of this, the amount of adjustment of the output in conjunction with the wavelength control is smaller. As a result, control is easier, and the wavelength control is capable of being completed in a shorter time.

Here, descriptions will be provided for the control method. In a case where control is intended to be made so that the wavelength shift can take place in the minus direction, it is better that the positive current is controlled. This is because the amount of current directly represents the amount of control, since the amount of wavelength shift is proportionate to the concentration of accumulated carriers, and ultimately, the amount of the current. On the other hand, in a case where control is intended to be made so that the wavelength shift can take place in the plus direction, it is better that the voltage is controlled. This is because the amount of the wavelength shift is proportionate to the amount of the applied voltage. A leakage current to the gain region 106 is present, and this leakage current becomes an uncertain factor in the case of the current control.

Now, descriptions will be provided for a configuration of the semiconductor layer in the phase control region. In order to transmit a laser beam, it is necessary that the optical loss is kept small in each of the core layers (denoted by reference numerals 313, 314 and 315 in FIG. 9) in the phase control region 107. In a case where the core layers have the same layer configuration as the MQW (Multiple Quantum Well) layer 310 in the gain unit 106, this makes the optical loss enormous, and accordingly no laser beam is transmitted. For this reason, it is essential that the layer 314 which is one of the cores in the phase control region 107 should be different in layer configuration from the MQW layer 310 in the gain unit 106, and that the optical loss should be kept small at the operating wavelength, or at a 1.55-μm band.

Figure 11:
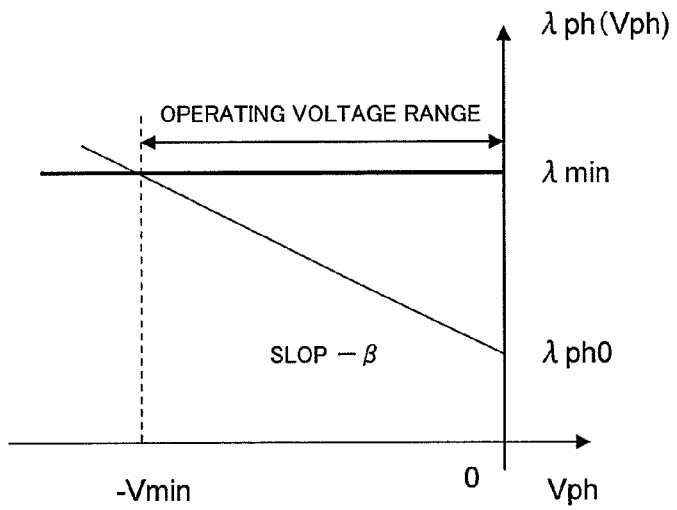
FIG. 11 is a diagram showing an operational range of the gain chip according to the present invention.

Furthermore, an examination will be made on an operating range of a phase control voltage V ph. The bandgap wavelength of the core layer 314 in the phase control region 107 is denoted by λ ph0; the bandgap wavelength having a V ph dependency, λ ph (Vph); the rate of change of λ ph relative to the applied voltage V ph, −β; and a wavelength which is the shortest among wavelengths at which the laser operates, λmin. As shown in FIG. 11, it is known that a voltage application makes the bandgap wavelength λ ph (V ph) longer. When λ ph (V ph)>λmin, the optical loss becomes prominent due to the interband absorption. As a result, no laser beam is transmitted, or the optical output deteriorates to a large extent. An influence can be seen in the prominent optical loss which took place at −8 V as shown in FIG. 2. Consequently, it is essential that the operation should be carried out within the range where V ph satisfies λ ph (V ph)>λmin. V min that represents the smallest value of V ph is expressed by the following equation:

$$V\mathrm{min}=(\lambda ph0-\lambda\mathrm{min})/\beta$$

Figure 12:
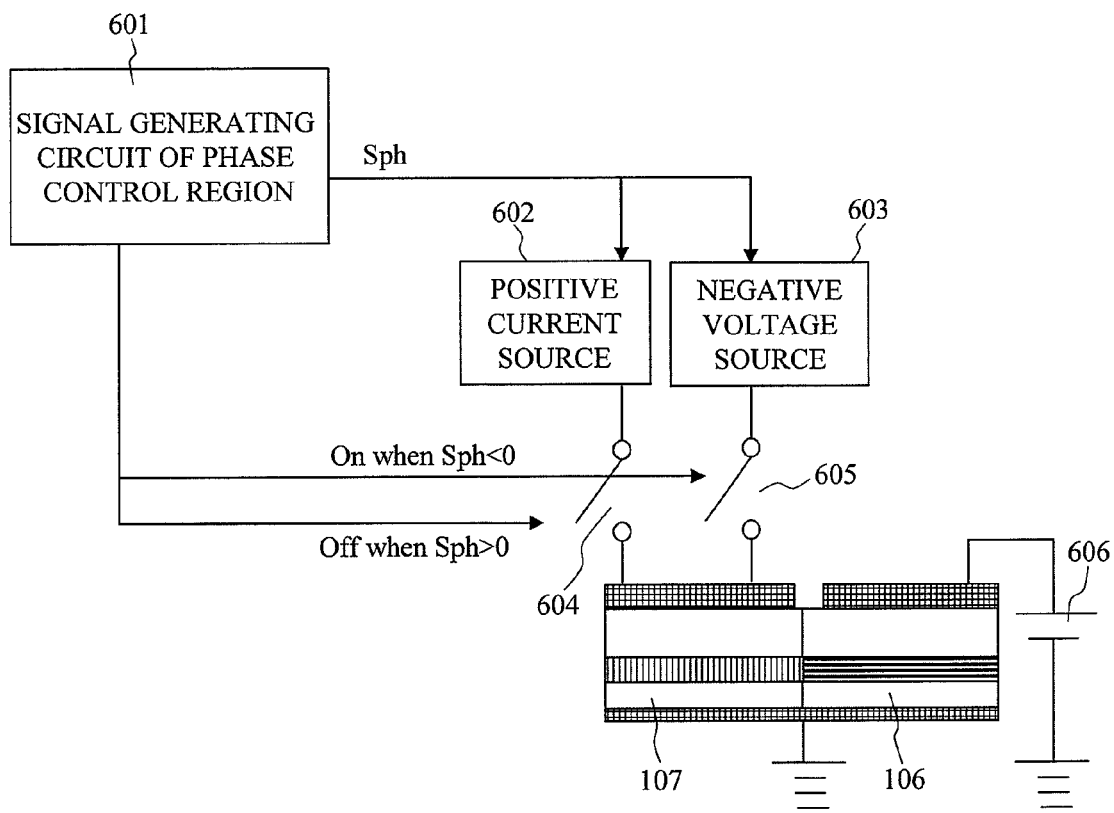
FIG. 12 is a schematic diagram of a wavelength tunable laser apparatus including a control circuit.
Figure 13:
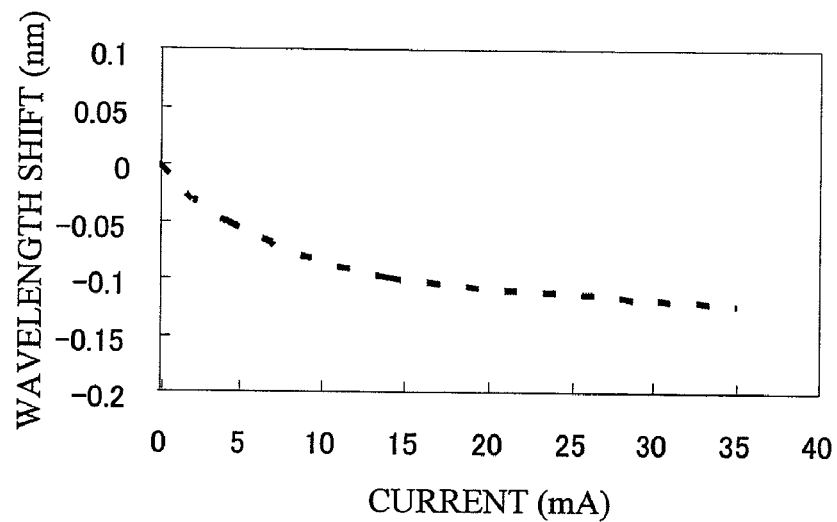
FIG. 13 is a diagram for explaining a conventional method of shifting wavelengths.
Figure 14:
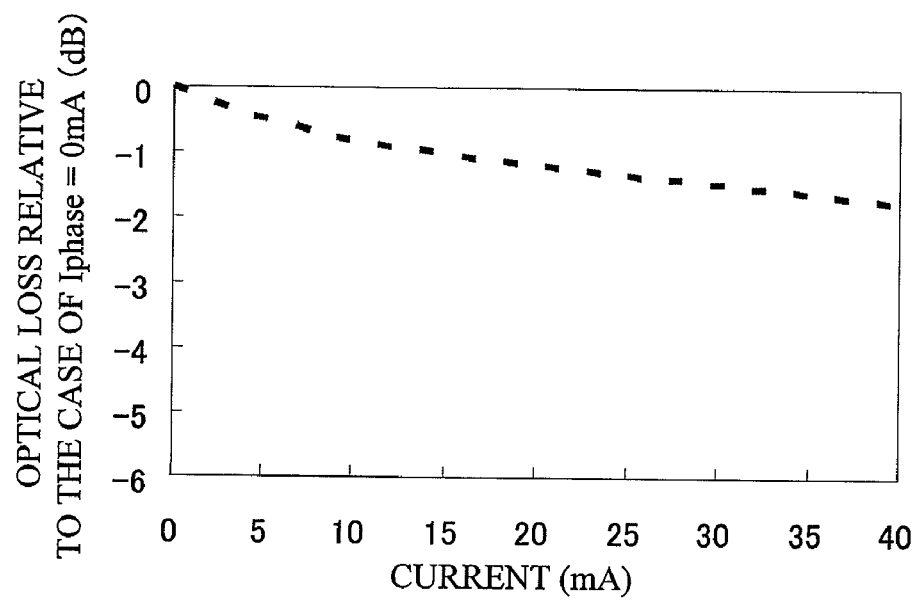
FIG. 14 is a diagram for explaining an amount of optical loss in conjunction with wavelength shift that is observed in the conventional method.

FIG. 12 shows a schematic diagram of a wavelength tunable laser apparatus including a control circuit. A constant current, for example, 300 mA is applied to the gain region 106 by a current supply 606. A phase control region control signal generating circuit 601 calculates an amount of signals S ph to be transmitted to the phase control region for the purpose of obtaining a desired wavelength, and thus provides the resultant signal to a positive current supply 602 and a negative bias supply 603. Concurrently, the circuit 601 generates switch on/off signals. Thus, when S ph>0, a switch 604 for connecting the current supply 602 with the phase control region 107 is turned on. When S ph<0, a switch 605 for connecting the negative bias supply 603 with the phase control region 107 is turned on. As a result, the wavelength shift control shown in FIG. 1 can be realized.

What is claimed is:

1. A wavelength tunable laser apparatus comprising:
   a semiconductor substrate including:
   a region which emits light when a current is applied thereto and having a first semiconductor composition, and
   a phase control region including a pn junction section having a second semiconductor composition;
   a gain chip in which the light-emitting region and the phase control region are connected to each other with a waveguide;
   a wavelength selective mirror constituting a cavity between itself and an optical output end surface of the gain chip;
   a current source for causing a positive current to flow into the pn junction section in the phase control region;
   a voltage source for applying a negative bias to the pn junction section in the phase control region; and
   a control unit for selectively driving any one of the current source and the voltage source depending on a direction of wavelength shift;
   wherein the first semiconductor composition of the light-emitting region and the second semiconductor composition of the phase control region are different from each other.

2. The wavelength tunable laser apparatus as recited in claim 1, wherein, the control unit drives the current source when a laser wavelength is to be shifted to a shorter wavelength side from a wavelength with the current supply and the voltage supply being turned off, and drives the voltage supply when the laser wavelength is to be shifted to a long wavelength side from the wavelength with the current supply and the voltage supply being turned off.

3. The wavelength tunable laser apparatus as recited in claim 1, wherein, $$V\mathrm{min}=(\lambda ph0-\lambda\mathrm{min})/\beta$$

where a semiconductor composition wavelength constituting the phase control region is denoted by λ ph0; a wavelength which is the shortest among wavelengths at which the laser operates, λmin; a rate of change of λ ph relative to an applied voltage V ph, −β; and a value representing the smallest one among operating minus voltages, −V min.

4. A wavelength control method for a wavelength tunable laser apparatus including: a semiconductor substrate having: a region which emits light when a current is applied thereto and having a first semiconductor composition, and a phase control region including a pn junction section having a second semiconductor composition; a gain chip in which the light-emitting region and the phase control region are connected to each other with a waveguide; and a wavelength selective mirror constituting a cavity between itself and an optical output end surface of the gain chip, the method comprising the steps of:
   causing a positive current to flow to the pn junction section of the phase control region when a laser wavelength is to be shifted to a shorter wavelength side from a wavelength with no phase control signal being applied to the phase control region; and
   applying a voltage with a negative bias to the pn junction section of the phase control region when a laser wavelength is to be shifted to a longer wavelength side from a wavelength with no phase control signal being applied to the phase control region;
   wherein the first semiconductor composition of the light-emitting region and the second semiconductor composition of the phase control region are different from each other.

5. The wavelength tunable laser apparatus recited in claim 1, wherein the voltage source applies only the negative bias to the pn junction section in the phase control region.

6. The wavelength control method for a wavelength tunable laser apparatus of claim 4, wherein the step of applying the voltage includes applying only the negative bias to the pn junction section in the phase control region.

* * * * *